219-121

MTR04 OR 3,916,142 SR

United States Patent [19]

Ennis

[11] B 3,916,142

[45] Oct. 28, 1975

[54] METHOD OF STATIC TRIMMING OF FILM DEPOSITED RESISTORS

[75] Inventor: Thomas E. Ennis, Niles, Ill.

[73] Assignee: GTE Automatic Electric Laboratories Incorporated, Northlake, Ill.

[22] Filed: Mar. 29, 1973

[21] Appl. No.: 346,210

[44] Published under the Trial Voluntary Protest Program on January 28, 1975 as document no. B 346,210.

[52] U.S. Cl. ............. 219/121 LM; 29/610; 219/68; 338/195

[51] Int. Cl.² ............. B23K 27/00

[58] Field of Search ... 219/121 L, 121 LM, 121 EB, 219/121 EM, 69, 68; 29/610; 331/94.5; 83/63, 522; 338/195

[56] References Cited

UNITED STATES PATENTS 3,486,221 12/1969 Robinson ..................... 219/121 LM
3,534,472 10/1970 Jong et al. ................... 219/121 LM
3,548,303 12/1970 Helgeland ........................ 29/610
3,750,049 7/1973 Dowley et al. ...................... 331/94.5

*Primary Examiner*—J. V. Truhe
*Assistant Examiner*—Clifford C. Shaw

[57] ABSTRACT

A method of trimming a film deposited resistor of an RC network used in a hybrid time delay circuit. After measurement of the circuit initial time delay a variable resistor is connected in parallel with the capacitor of the RC network while a voltage is applied to the time delay circuit. The variable resistance is adjusted to provide a preselected voltage drop as measured by a voltmeter. Based upon the initial and desired time delays and the value of the variable resistance to attain the first preselected voltage a final resistance value for the variable resistor is readjusted to the final value and the film resistor is trimmed until the voltage drop across the readjusted variable resistor is restored.

2 Claims, 2 Drawing Figures

METHOD OF STATIC TRIMMING OF FILM DEPOSITED RESISTORS

Figure 1:
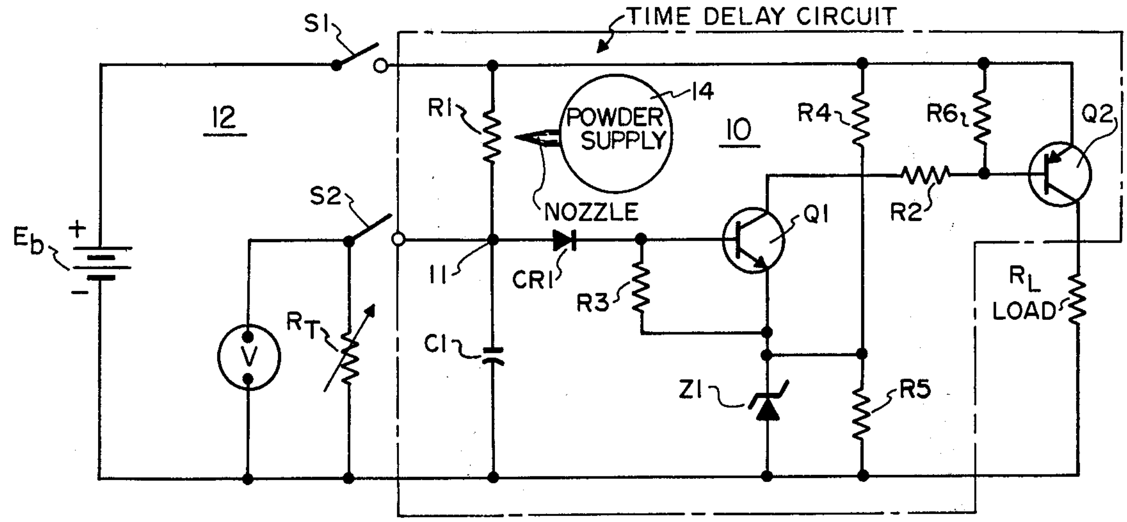

The present invention relates to the trimming calibration of film deposited resistors, and more particularly, relates to a method of static trimming of film resistors in hybrid time delay circuits.

Many electronic circuits employ resistor-capacitor element combinations formed as by film deposition on a substrate which comprises part of a hybrid circuit, either of the thick film or thin film circuit configuration. Such resistor-capacitor combinations often comprise oscillator networks or provide RC time constants for time delay circuits. Accurate frequency tuning of an oscillator network and timing adjustments of RC time delay networks both require precision trimming of the film deposited resistors of resistor-capacitor combinations. In instances where the hybrid film oscillators and time delay circuits are to be mass-produced as in production or assembly line operations, the speed and accuracy of the trimming techniques and the attendant control of such trimming become economically important. For production purposes, it is desirable that the trimming adjustment be accomplished automatically and quickly as well as precisely without undesirable overtrimming.

The trimming of film resistors to alter the resistor values is normally accomplished by the control application of a high velocity stream of abrasive powders to abrade the film resistor or by a computer controlled laser trimmer. Both such techniques are commonly employed to increase the resistance value by removing portions of the resistive film. Static precision trimming is often done in a number of decreasingly smaller precalculated increments with resistance verification measurements made after each trimming so as to avoid costly overshooting by the removal of too much resistive film. Static trimming is accomplished with the resistor-capacitor combination in a non-operating state as contrasted to automatic trimming wherein the circuit to be trimmed is operational while continuous trimming is done. For the oscillator networks, the resonant frequency of the oscillator is monitored by such techniques as automatic frequency calculations provided from measured numbers of zero crossings, i.e., the number of times a filtered signal crosses a zero reference axis in a given direction, such as the positive direction. For time delay circuits, the time delay must be measured as with conventional techniques of electronic counters or oscilloscopes after each static trim and the resistive value of the RC network which will produce the measured time delay then calculated (indirect measurement).

It has been heretofore more difficult to provide automatic on-line trimming of the RC networks of hybrid time delay circuits than has been the case for active trimming of RC networks of hybrid oscillator circuits. It is the opinion of the applicant that the primary reason for the difficulty lies in that for oscillator circuits, frequency measurements relate directly to resistance values of the film resistor being trimmed so as to provide a direct method of monitoring the resistance value; while for time delay circuits, continuous trimming of the film resistor throughout the period necessary to measure the time delay obviously could readily result in an overtrim situation. Hence, for resistive trimming calibration of film deposited time delay circuits, it is better to use a static trimming procedure, i.e., to measure the initial time delay of the circuit, calculate the required resistance value for a given time delay, abrade and remeasure until the correct resistance value is obtained. The applicant's present invention employs such a static trimming procedure which presents the feature of reducing the number of necessary trims while reducing the risk of an overshoot trim.

It is an object of the present invention to provide an improved static trimming method for film deposited resistors. It is another object to provide such a method which employs an algorithmic relationship between the actual time delay of the hybrid circuit and the resistance value of the film resistor in order to measure a required resistance value for the desired time delay. It is a further object of the invention to provide a more continuous trimming of the film resistor until the desired time delay is obtained without undue risk of overtrimming.

A method of trimming a film deposited resistor of a resistor-capacitor element combination of a time delay circuit providing a measured initial time delay by interconnecting a variable resistor with said time delay circuit in parallel with the capacitor of the combination, interconnecting a voltmeter across said variable resistor, adjusting said variable resistor until said voltmeter indicates a first preselected voltage, determining a final resistance for said variable resistor through the use of the equation $$R_f = T_f R / T$$

where $R_f$ = final resistance of the variable resistor $T_i$ = initial time delay $T_f$ = final time delay desired $R_i'$ = resistance to attain said first preselected voltage, readjusting said variable resistor to attain $R_f$ therewith, and trimming said film deposited resistor in a controlled manner until said voltmeter again indicates said first preselected voltage.

Figure 2:
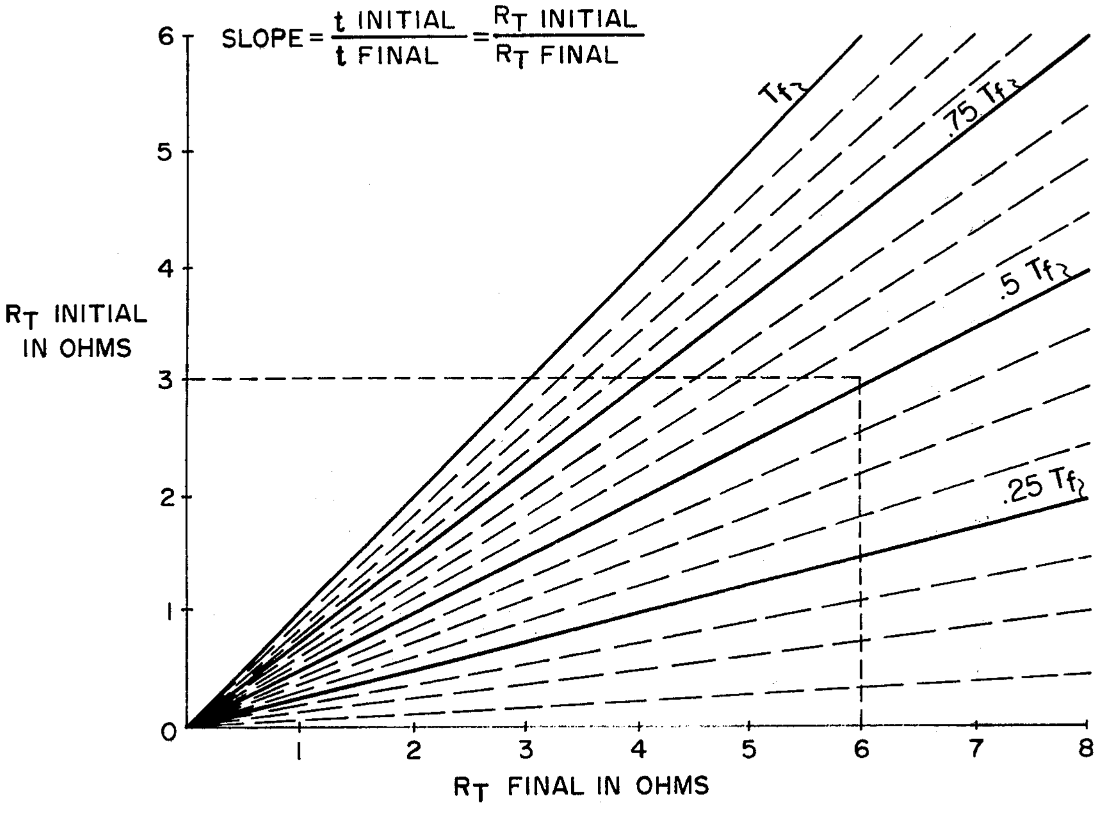

FIG. 1 is a schematic representation of a time delay circuit having an RC element combination and showing a test circuit to be used in connection therewith; and FIG. 2 is a graphical representation of a linear relationship between an initial resistance value of a test resistor and its final resistance value needed to produce a final time delay for the RC element combination.

FIG. 1 shows a two stage time delay circuit 10 for use in energizing a predetermined electrical load resistance $R_L$ a selected time delay T after initial energization of the circuit 10 as through closure of a switch S1. The time delay circuit includes a resistor-capacitor R1, C1 element combination or network having a common electrical node 11 then connected to the base of a first stage amplifier transistor Q1, the collector of which is coupled to the base of a second stage amplifier transistor Q2 through a current-limiting resistor R2. The load $R_L$ is connected to the collector of the transistor Q2 in a conventional manner.

The time delay circuit 10 is selectively connectible to a test circuit 12 through switches S1 and S2, the switch S1 providing a suitable dc power source $E_b$ for the operation of the circuit 10 and the switch S2 interconnecting a variable test resistor $R_T$ and a dc voltmeter V. The threshold voltage of the general purpose NPN transistor Q1 is determined by a zener diode Z1 and the voltage drop across a base bias resistor R3. A diode CR1 in the base circuit of the transistor Q1 conducts when the voltage at electrical node 11 is more positive than the zener diode voltage. A pair of resistors R4-R5 comprise a voltage divider and provide a return current path for the operational zener diode Z1. A resistor R6 serves as a base return for the general purpose PNP transistor Q2. In accordance with present microelectronic circuit packaging, the entire time delay circuit 10 can be mounted on a suitable substrate with the resistor R1 to be trimmed formed as film deposited resistive material using thick film or thin film hybrid circuit packaging.

FIG. 1 shows at 14 an abrader source having a supply of abrasive powder to be projected through a nozzle in a high velocity stream for removing portions of the resistive film of the resistor R1 of the RC network. The abrader source 14 is shown for the purpose of illustrating one manner of resistive trimming and it should be understood that equally suitable means for removing resistive film could be used such as through the use of a laser trimmer. Such trimming techniques are generally well known and do not constitute a part of the novelty of the present invention. The film deposited resistor R1 is trimmed either continuously or repeatedly until its resistive value is equal to that predetermined value which will provide the final desired time delay $T_f$.

As was stated previously, accurate trimming of hybrid film time delay circuits has not been possible heretofore while the time delay circuit is operating. Also, it is difficult to accurately measure the resistive value of the RC network because of the effects of other operational circuit elements. Repeated trim and test cycles are usually required to trim the RC network to its required resistive value. Further, the greater the degree of accuracy required to achieve a desired time delay, the greater the number of trim and test cycles will be required. When the desired time delay is of long duration, the trim and test method of trimming is very time consuming and expensive.

In accordance with the present invention, there is provided a parameter $\rho$ of the time delay circuit which is directly related to the resistive value of the RC network and which changes linearly with respect to trimming operations. So long as the threshold voltage of the first stage transistor Q1 is not reached, the RC network is the only portion of the time delay circuit which is operational, and the parameter $\rho$ is seen to remain a linear function.

For a given time delay circuit of the configuration of the circuit 10, when switch S1 is closed, the capacitor C1 charges through the resistor R1 until the threshold voltage $v_t$ is reached. At this voltage level, the transistor Q1 and then transistor Q2 will conduct to energize the load. The threshold voltage $v_t$ can be represented by the following expression:

$$v_t = E_b\,(1 - e^{-\,t/RC})$$

[A]

Through mathematical manipulation of the expression A to separate $t$ (time) and R (resistance) from the other parameters, the following can be provided:

$$v_t/E_b = 1 - 1/et/RC$$

$$1 - v_t/E_b = 1/et/RC$$

$$e^{t/RC} = 1/1 - v_t/E_b$$

$$t/RC = \ln 1/1 - v_t/E_b \text{, and finally}$$

$$\rho = t/R = C \ln 1/1 - v_t/E_b$$

[B]

where the right hand expression is of constant value for any given time delay circuit, and $t$ is shown to be directly proportional to R and to provide the parameter $\rho$. Further, where the initial time delay is $T_i$, the final time delay is $T_f$, the initial value of R1 before trimming is $R_i$, and the final resistance of the resistor $R_T$ is $R_f$, the ratio of $T_i/R_i$ can be seen to equal the ratio of $T_f/R_f$. Hence $$T_i/R_i = T_f/R_f,$$

[C]

and solving for $R_f$, we have the expression $$R_f = T_f R_i'/T_i$$

[D]

It is proposed that a voltage divider circuit arrangement be provided for permitting R1 to be readily determined. Accordingly, the variable test resistor $R_T$ is connectible through switch S2 to the electrical node 11 and the voltmeter V is then connected in electrical parallel with the test resistor $R_T$ and the charging capacitor C1. Preferably, the variable test resistor should be of a type for which the resistance value can be read directly or easily determined. Firstly, the time delay $t_i$ is measured directly by closing the switch S1 and a reading taken. Secondly, the switch S2 is closed and the variable test resistor $R_T$ is interconnected with the delay circuit which provides a voltage drop at node 11 sufficient to turn off transistor $Q_1$. The variable test resistor $R_T$ is then adjusted until the voltmeter V attains a first preselected voltage value below the threshold voltage $v_t$ so as not to trigger the operation of the transistor Q1. Now, represent the value of the variable test resistor by $R_i'$ which is required to produce a voltage reading of the first preselected voltage, and re-express the formula D as $$R_f = T_f R_i'/T_i.$$

[E]

Since the final time delay $T_f$ is a known quantity, the expression [E] can be solved as through the use of a general purpose digital computer or other suitable calculator means to determine the final value of the resistor $R_T$. Next, the variable resistor $R_T$ is adjusted to equal the final resistive value as determined for $R_f$, and the trimming of the resistor R1 can be initiated and continued until the voltmeter V again attains the first preselected voltage level. The maximum trimming rate will be limited by the desired tolerance of the final trim, the time constant of $C_1$, $R_1$, $R_T$ and the tracking rate of the voltmeter which is used. The trimming rate may be increased by selecting the first preselected voltage to be a smaller percentage of the power source voltage, $E_b$. This allows capacitor $C_1$ to discharge at a faster rate thus eliminating any significant error in the final value of $R_1$. At this time the trimming process is halted and a timing verification measurement made. The resistor R1 of the RC network should be substantially equal to its final resistance value as was determined to be needed. Timing values have been attained within a tolerance of ±1% of nominal with a single continuous trimming step.

FIG. 2 shows a graphical representation of the linear relationship between the resistive values of the initial test resistance and the final test resistance to which $R_T$ should be adjusted. This nomograph shows a plurality of time delay radii, each representing a percentage of the final time delay $T_f$ such as 0.25 $T_f$ – 1.00 $T_f$. The ordinate represents the value $R_i'$ in the expression E. The abscissa represents the value $R_T$ final or $R_f$ in the equation E, the final resistive value of the resistor $R_T$. For example, if the initial time delay $T_i$ is 0.50 the final time delay $T_f$ and the resistance $R_i'$ is 3 ohms, the value of $R_T$ final or $R_f$ is equal to 6 ohms, whereupon the variable resistor is set at 6 ohms and trimming is done until the voltmeter V attains the first preselected voltage.

In summary, therefore, the above method of trimming can be accomplished by fully automatic on-line test equipment, or can be accomplished step-by-step by a test operator. In either case, the trim and test procedure is reduced to a single continuous trimming step rather than a number of such trim and test steps. Briefly, the untrimmed time delay must be determined; the test resistor connected and adjusted to cause the voltmeter to read the first preselected voltage; a corresponding value of the final test resistance determined; the test resistor readjusted to equal this final test resistance value; trimming of the resistor R1 until the voltmeter readjusts to equal the first preselected voltage; and the final time delay verified.

What is claimed is:

1. A method of trimming a film deposited resistor of a resistor-capacitor combination of a time delay circuit adapted for coupling between a voltage source and a load for providing a time delay in the application of a voltage from said voltage source to said load and wherein said resistor and capacitor are coupled in series with one another and selectively in parallel with said voltage source, said method comprising the steps of selectively connecting said voltage source to said time delay circuit, measuring the time delay between connection of said voltage source to said time delay circuit and the application of said voltage to said load to thereby determine an initial time delay, selectively interconnecting a variable resistor in parallel with the capacitor of said resistor-capacitor combination, interconnecting means for measuring a voltage across said variable resistor, adjusting said variable resistor to provide a first preselected voltage thereacross, determining a final resistance value for said variable resistor according to the relationship $$R_f = T_f R_i / T_i$$

where $R_f$ is said final resistance value of said variable resistor, $T_f$ is the final time delay desired, $T_i$ is the initial time delay measured, and $R_i'$ is the resistance value of said variable resistor required to attain said first preselected voltage thereacross, readjusting said variable resistor to said final resistance value, and trimming said film deposited resistor until the voltage across said variable resistor is returned to said first preselected voltage.

2. The method set forth in claim 1 wherein said time delay circuit includes a voltage activated switch coupled at one side to the connection between said resistor and said capacitor and a driver amplifier coupled between said voltage actuated switch and said load, and said step of adjusting said variable resistor to said first preselected voltage includes the selection of said first preselected voltage to be less than the voltage required to activate said voltage activated switch.

* * * * *

UNITED STATES PATENT OFFICE

CERTIFICATE OF CORRECTION

PATENT NO. : 3,916,142

DATED : October 28, 1975

INVENTOR(S) : THOMAS E. ENNIS

It is certified that error appears in the above-identified patent and that said Letters Patent are hereby corrected as shown below:

Column 6, line 19, should be -- $R_f = T_f R_i'/T_i$ --

Signed and Sealed this

*seventeenth* Day of *February 1976*

[SEAL]

*Attest:*

RUTH C. MASON
*Attesting Officer*

C. MARSHALL DANN
*Commissioner of Patents and Trademarks*